United States Patent
Wu et al.

(10) Patent No.: US 7,067,896 B2
(45) Date of Patent: Jun. 27, 2006

(54) MICROELECTRONIC FABRICATION HAVING EDGE PASSIVATED BOND PAD INTEGRATED WITH OPTION SELECTION DEVICE ACCESS APERTURE

(75) Inventors: Juei-Kuo Wu, Hsin-Chu (TW); Yi-Lang Wu, Pingjen (TW); Lin-June Wu, Hsin-Chu (TW); Dian-Hau Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/293,079

(22) Filed: Nov. 13, 2002

(65) Prior Publication Data

US 2004/0089916 A1    May 13, 2004

(51) Int. Cl.
*H01L 29/00*    (2006.01)
(52) U.S. Cl. .................................... 257/529; 257/530
(58) Field of Classification Search ................. 257/529, 257/530; 438/130, 131, 132, 600, 601
See application file for complete search history.

(56) References Cited

U.S. PATENT DOCUMENTS

| 5,985,765 A | 11/1999 | Hsiao et al. |
| 6,054,340 A | 4/2000 | Mitchell et al. |
| 6,100,117 A * | 8/2000 | Hao et al. ................... 438/132 |
| 6,201,733 B1 * | 3/2001 | Hiraki et al. ........... 365/185.08 |
| 6,300,252 B1 | 10/2001 | Ying et al. |
| 6,440,833 B1 * | 8/2002 | Lee et al. ................... 438/601 |
| 6,911,386 B1 * | 6/2005 | Lee et al. ................... 438/612 |
| 2004/0014260 A1 * | 1/2004 | Wu et al. ................... 438/132 |

FOREIGN PATENT DOCUMENTS

| CN | 1213165 A | 4/1999 |
| JP | 2001274247 A * | 10/2001 |
| WO | WO 200219426 A1 * | 3/2002 |

OTHER PUBLICATIONS

Seta et al., "Semiconductor Device and Manufacturing Method Therefor," English translation of published Japanese patent application No. JP 2001-274247 A, JPO, Oct. 2001.*

* cited by examiner

*Primary Examiner*—Stephen W. Smoot
(74) *Attorney, Agent, or Firm*—Thomas, Kayden, Horstemeyer & Risley

(57) ABSTRACT

Within an option selection device structure and a method for fabrication thereof there is formed a terminal metal layer and an option selection device at a co-planar level over a microelectronic substrate. The option selection device is passivated with: (1) a terminal metal passivation layer having an etch stop layer within its thickness; and (2) a bond pad passivation layer. There is simultaneously also formed through the bond pad passivation layer: (1) a via which accesses a bond pad formed contacting the terminal metal layer; and (2) an aperture over the option selection device which stops at the etch stop layer.

20 Claims, 2 Drawing Sheets

MICROELECTRONIC FABRICATION HAVING EDGE PASSIVATED BOND PAD INTEGRATED WITH OPTION SELECTION DEVICE ACCESS APERTURE

BACKGROUND OF THE INVENTION

1. Field of the Invention

The present invention relates generally to microelectronic fabrications. More particularly, the present invention relates to bond pads and option selection devices within microelectronic fabrications.

2. Description of the Related Art

Less common, but nonetheless also frequently present within microelectronic fabrications, are option selection devices such as fuses and anti-fuses. Option selection devices are desirable in the art of microelectronic fabrication insofar as option selection devices provide means for rearranging microelectronic circuits within microelectronic fabrications after the microelectronic fabrications have been fabricated. An opportunity for rearranging a microelectronic circuit after fabrication of a microelectronic fabrication often allows for: (1) field selection of a microelectronic circuit from an array of microelectronic circuits within a microelectronic fabrication; as well as (2) substitution of a functionally defective microelectronic circuit with a functionally operative microelectronic circuit within a microelectronic fabrication.

While option selection device structures are thus desirable in the art of microelectronic fabrication, option selection device structures are nonetheless not entirely without problems in the art of microelectronic fabrication.

In that regard, it is often difficult in the art of microelectronic fabrication to efficiently and reliably fabricate microelectronic fabrications having formed therein option selection device structures.

It is thus desirable in the art of microelectronic fabrication to efficiently and reliably fabricate microelectronic fabrications having formed therein option selection device structures.

It is towards the foregoing object that the present invention is directed.

Various option selection device structures, and methods for fabrication thereof, have been disclosed in the art of microelectronic fabrication.

Included among the option selection device structures and methods for fabrication thereof, but not limiting among the option selection device structures and methods for fabrication thereof, are option selection device structures and methods for fabrication thereof disclosed within: (1) Hsiao et al., in U.S. Pat. No. 5,985,765 (a integrated passivated bond pad and option selection device structure within a microelectronic fabrication); (2) Mitchell et al., in U.S. Pat. No. 6,054,340 (a method for forming an aperture for accessing a deep option selection device within a microelectronic fabrication); and (3) Ying et al., in U.S. Pat. No. 6,300,252 (another method for forming an aperture accessing a deep option selection device within a microelectronic fabrication).

Desirable in the art of microelectronic fabrication are additional option selection device structures and methods for fabrication thereof, which may be efficiently and reliably fabricated within microelectronic fabrications.

It is towards the foregoing object that the present invention is directed.

SUMMARY OF THE INVENTION

A first object of the present invention is to provide an option selection device structure and a method for fabrication thereof, for use within a microelectronic fabrication.

A second object of the present invention is to provide an option selection device structure and a method for fabrication thereof in accord with the first object of the present invention, wherein the option selection device structure is efficiently and reliably fabricated within the microelectronic fabrication.

In accord with the objects of the present invention, there is provided an option selection device structure for use within a microelectronic fabrication and a method for fabricating the option selection device structure for use within the microelectronic fabrication.

In accord with the present invention, the option selection device structure comprises a substrate. The option selection device structure also comprises a terminal metal layer and an option selection device formed at a co-planar level over the substrate. The option selection device structure also comprises a patterned terminal metal passivation layer formed covering the option selection device while forming a via which accesses the terminal metal layer. Within the present invention, the patterned terminal metal passivation layer has formed within its thickness an etch stop layer. The option selection device structure also comprises a bond pad layer formed within the via and contacting the terminal metal layer. Finally, the option selection device structure also comprises a patterned bond pad passivation layer formed upon the patterned terminal metal passivation layer and edge passivating the bond pad layer. Within the present invention, the patterned bond pad passivation layer has formed therethrough and the patterned terminal metal passivation layer having formed aligned therein an aperture which terminates over the option selection device at the etch stop layer.

The option selection device structure of the present invention contemplates a method for fabricating the option selection device structure of the present invention.

The present invention provides an option selection device structure and a method for fabrication thereof, for use within a microelectronic fabrication, wherein the option selection device structure is efficiently and reliably fabricated.

The present invention realizes the foregoing object by forming an option selection device at a co-planar level with a terminal metal layer over a substrate, and then passivating the option selection device sequentially with: (1) a patterned terminal metal passivation layer having formed within its thickness an etch stop layer; and (2) a patterned bond pad passivation layer which edge passivates a bond pad formed contacting the terminal metal layer. Finally, the patterned bond pad passivation layer has formed therethrough, and the patterned terminal metal passivation layer has formed aligned therein, an aperture which terminates over the option selection device at the etch stop layer.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides an option selection device structure and a method for fabrication thereof, for use within a microelectronic fabrication, wherein the option selection device structure is efficiently and reliably fabricated.

The present invention realizes the foregoing object by forming an option selection device at a co-planar level with a terminal metal layer over a substrate, and then passivating the option selection device sequentially with: (1) a patterned terminal metal passivation layer having formed within its thickness an etch stop layer; and (2) a patterned bond pad passivation layer which edge passivates a bond pad formed contacting the terminal metal layer. Finally, the patterned bond pad passivation layer has formed therethrough, and the patterned terminal metal passivation layer has formed aligned therein, an aperture which terminates over the option selection device at the etch stop layer.

Referring now to FIG. 1 to FIG. 5, there is shown a series of schematic cross-sectional diagrams illustrating the results of progressive stages of fabricating, in accord with a preferred embodiment of the present invention, a microelectronic fabrication having formed therein an option selection device structure.

Figure 1:
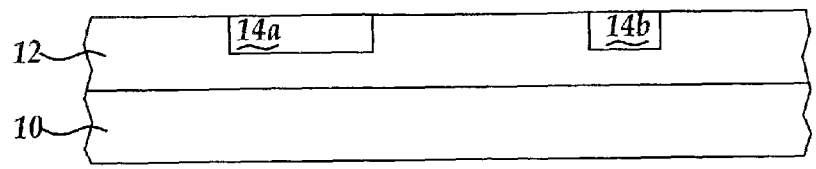
FIG. 1, FIG. 2, FIG. 3, FIG. 4 and FIG. 5 show a series of schematic cross-sectional diagrams illustrating the results of progressive stages of fabricating, in accord with a preferred embodiment of the present invention, a microelectronic fabrication having formed therein an option selection device structure.

Shown in FIG. 1 is a schematic cross-sectional diagram of the microelectronic fabrication at an early stage in its fabrication in accord with the preferred embodiment of the present invention.

Shown in FIG. 1 is a substrate 10 having formed thereover a dielectric layer 12 in turn having formed therein a terminal metal layer 14a formed at a co-planar level with an option selection device 14b.

Within the preferred embodiment of the present invention, the substrate 10 may be employed within a microelectronic fabrication selected from the group including but not limited to integrated circuit microelectronic fabrications, ceramic substrate microelectronic fabrications and optoelectronic microelectronic fabrications. Most typically and preferably, the substrate 10 is a semiconductor substrate employed within a semiconductor integrated circuit microelectronic fabrication.

Although not specifically illustrated within the schematic cross-sectional diagram of FIG. 1, and in particular but not exclusively when the substrate 10 consists of or comprises a semiconductor substrate as employed within a semiconductor integrated circuit microelectronic fabrication, the substrate 10 has formed therein and/or thereupon microelectronic devices as are conventional within the microelectronic fabrication within which is employed the substrate 10. Such microelectronic devices may include, but are not limited to, resistors, transistors, diodes and capacitors.

Within the preferred embodiment of the present invention, the dielectric layer 12 is typically and preferably formed as a laminate of several dielectric materials, including but not limited to generally lower dielectric constant dielectric materials (generally having a dielectric constant of less than about 4) and generally higher dielectric constant dielectric materials (generally having a dielectric constant of greater than about 4). Typically and preferably, the dielectric layer 12 is formed as a laminate formed to a thickness of from about 100 to about 50,000 angstroms.

Within the preferred embodiment of the present invention, the terminal metal layer 14a and the option selection device 14b, the latter of which is typically and preferably a fuse but may alternatively be an anti-fuse, are typically formed of a conductor material such as but not limited to a copper containing conductor material or an aluminum containing conductor material. Typically and preferably, each of the terminal metal layer 14a and the option selection device 14b is formed to a thickness of from about 1000 to about 50,000 angstroms.

Figure 2:
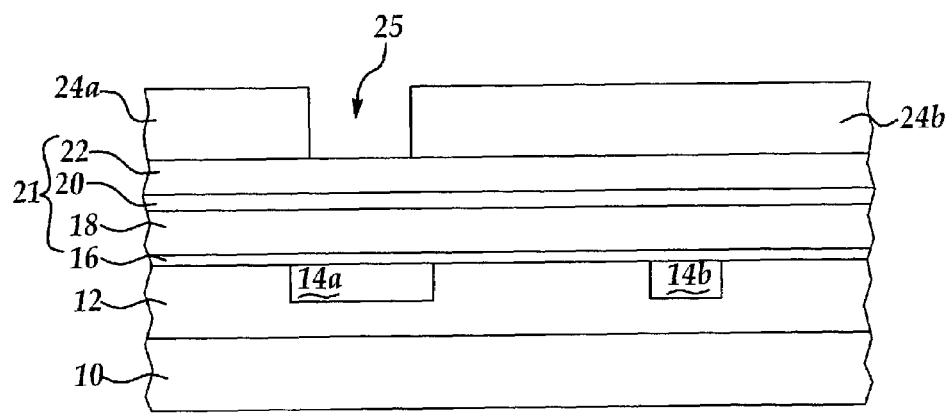

Referring now to FIG. 2, there is shown a schematic cross-sectional diagram illustrating the results of further processing of the microelectronic fabrication whose schematic cross-sectional diagram is illustrated in FIG. 1.

As is illustrated within FIG. 2, there is formed upon the dielectric layer 12 having formed at the co-planar level therein the terminal metal layer 14a and the option selection device 14b a series of blanket layers comprising: (1) a blanket barrier layer 16 formed upon the dielectric layer 12 having formed at the co-planar level therein the terminal metal layer 14a and the option selection device 14b; (2) a blanket first dielectric layer 18 formed upon the blanket barrier layer 16; (3) a blanket etch stop layer 20 formed upon the blanket first dielectric layer 18; and (4) a blanket second dielectric layer 22 formed upon the blanket etch stop layer 20. Within the preferred embodiment of the present invention the latter three blanket layers form a blanket terminal metal passivation layer 21 which has the blanket etch stop layer 20 formed completely within its thickness, although the blanket etch stop layer 20 may be positioned at an alternative terminal location within the blanket terminal metal passivation layer 21.

Within the preferred embodiment of the present invention, the blanket barrier layer 16, which may be optional but is desirable under circumstances where each of the terminal metal layer 14a and the option selection device 14b is formed of a copper metal or copper metal containing conductor layer, may for example be formed of a silicon nitride barrier material. The blanket barrier layer 16 may also be formed of a conductor barrier material, such as a metal or a metal nitride conductor barrier material (i.e. titanium, tantalum, tungsten metals, and nitrides thereof). In addition, within the preferred embodiment of the present invention, each of the blanket first dielectric layer 18 and the blanket second dielectric layer 22 is typically and preferably formed of a silicon oxide dielectric material, although other dielectric materials (such as spin-on-polymer (SOP) dielectric materials), may also be employed for forming the blanket first dielectric layer 18 and the blanket second dielectric layer 22. Finally, within the preferred embodiment of the present invention, the blanket etch stop layer 20 is typically and preferably formed of a silicon nitride etch stop material, although other etch stop materials, such as conductor etch stop materials, may also be employed for forming the blanket etch stop layer 20.

Typically and preferably: (1) the blanket barrier layer 16 is formed to a thickness of from about 50 to about 5000 angstroms; (2) the blanket first dielectric layer 18 is formed to a thickness of from about 100 to about 50,000 angstroms; (3) the blanket etch stop layer 20 is formed to a thickness of from about 50 to about 5000 angstroms; and (4) the blanket second dielectric layer 22 is formed to a thickness of from about 100 to about 50,000 angstroms.

Finally, there is shown within FIG. 2 a pair of patterned first photoresist layers 24a and 24b formed upon the blanket second dielectric layer 22 and defining a first aperture 25 above the terminal metal layer 14a.

Within the preferred embodiment of the present invention, the pair of patterned first photoresist layers 24a and 24b may be formed of photoresist materials as are conventional in the art of microelectronic fabrication, including but not limited to positive photoresist materials and negative photoresist materials. Typically and preferably, each of the pair of patterned photoresist layers 24a and 24b is formed to a thickness of from about 1000 to about 100,000 angstroms to define the first aperture 25 above the terminal metal layer 14a.

Figure 3:
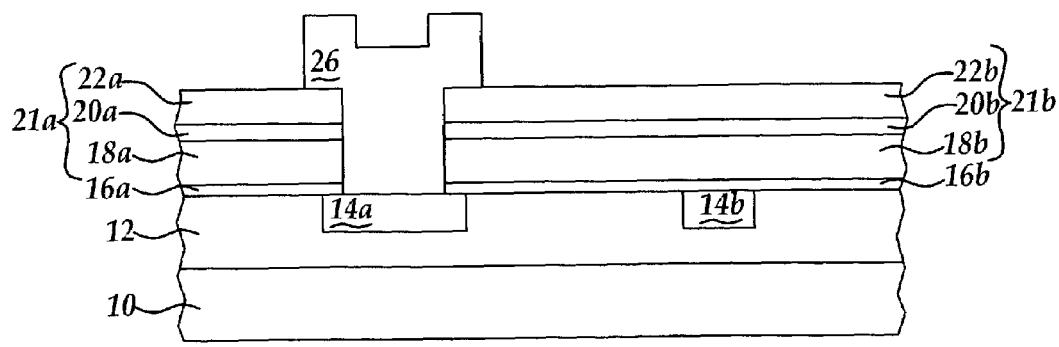

Referring now to FIG. 3, there is shown a schematic cross-sectional diagram illustrating the results of further processing of the microelectronic fabrication whose schematic cross-sectional diagram is illustrated in FIG. 2.

Shown in FIG. 3, in a first instance, is the results of sequentially patterning the blanket second dielectric layer 22, the blanket etch stop layer 20, the blanket first dielectric layer 18 and the blanket barrier layer 16 to form a corresponding series of patterned second dielectric layers 22a and 22b, patterned etch stop layers 20a and 20b, patterned first dielectric layers 18a and 18b and patterned barrier layers 16a and 16b, while employing the pair of patterned photoresist layers 24a and 24b as a pair of etch mask layers, to expose a portion of the terminal metal layer 14a. The foregoing series of patterned layers in an aggregate form a first via accessing the terminal metal layer 14a. The first three pair of the above four pair of patterned layers form a pair of patterned terminal metal passivation layers 21a and 21b, as illustrated in FIG. 3.

The foregoing patterning is typically and preferably effected employing an etchant gas composition, or a series of etchant gas compositions, appropriate to the materials from which are formed the blanket second dielectric layer 22, the blanket etch stop layer 20, the blanket first dielectric layer 18 and the blanket barrier layer 16. Subsequent to such patterning, the pair of patterned first photoresist layers 24a and 24b is stripped employing photoresist stripping methods and materials as are conventional in the art of microelectronic fabrication.

Finally, there is also shown within the schematic cross-sectional diagram of FIG. 3, and formed into the first via while contacting the terminal metal layer 14a, a bond pad layer 26.

Within the preferred embodiment of the present invention, the bond pad layer 26 may be formed from any of several conductor bond pad materials as are conventional or unconventional in the art of microelectronic fabrication, but typically and preferably of an aluminum or aluminum alloy conductor bond pad material. As is illustrated within FIG. 3, the bond pad layer 26 is typically and preferably patterned in a fashion such as to overlap the edges of the first via defined by the pair of patterned barrier layers 16a and 16b, the pair of patterned first dielectric layers 18a and 18b, the pair of patterned etch stop layers 20a and 20b and the pair of patterned second dielectric layers 22a and 22b.

Figure 4:
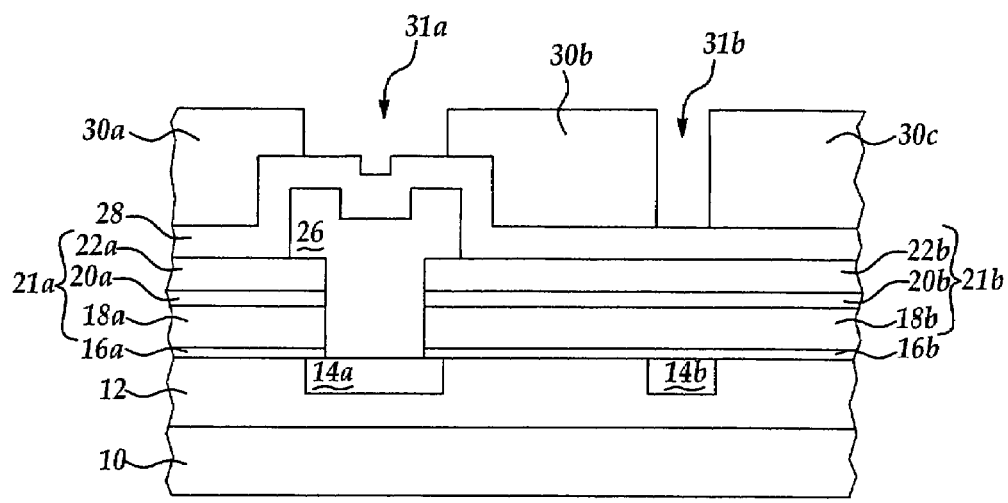

Referring now to FIG. 4, there is shown a schematic cross-sectional diagram illustrating the results of further processing of the microelectronic fabrication whose schematic cross-sectional diagram is illustrated in FIG. 3.

As is illustrated within FIG. 4, there is formed upon exposed portions of the pair of patterned second dielectric layers 22a and 22b, and the bond pad layer 26 a blanket bond pad passivation layer 28.

Within the preferred embodiment of the present invention, the blanket bond pad passivation layer 28 may be formed from any of several passivation dielectric materials as are conventional or unconventional in the art of microelectronic fabrication, but is typically and preferably formed as a laminate of a silicon oxide dielectric material having formed thereupon a silicon nitride dielectric material. Typically and preferably, the blanket bond pad passivation layer 28 is formed to a thickness of from about 1000 to about 900,000 angstroms.

Shown also within the schematic cross-sectional diagram of FIG. 4 is a series of patterned second photoresist layers 30a, 30b and 30c formed upon the blanket bond pad passivation layer 28 and defining a pair of apertures 31a and 31b, one centered over the bond pad 26 and the other centered over the option selection device 14b.

Within the preferred embodiment of the present invention, the series of patterned photoresist layers 30a, 30b and 30c may be formed from any of several photoresist materials as are conventional in the art of microelectronic fabrication, including but not limited to positive photoresist materials and negative photoresist materials. Typically and preferably, each of the series of patterned photoresist layers 30a, 30b and 30c is formed to a thickness of from about 1000 to about 90,000 angstroms.

Figure 5:
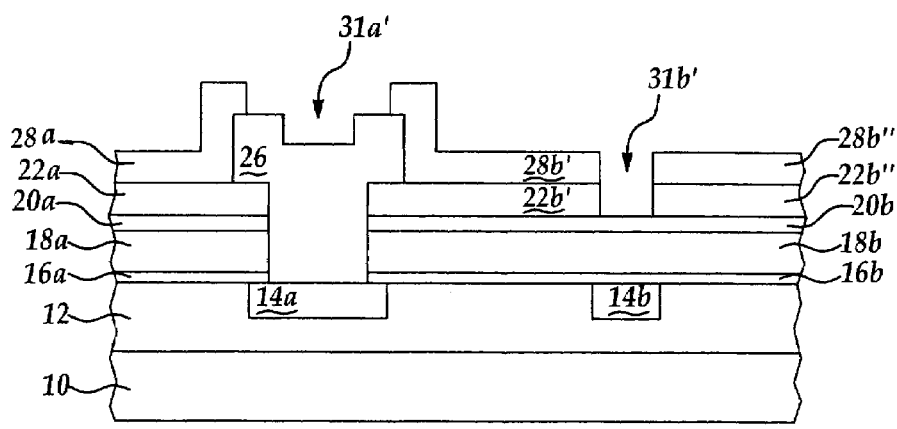

Referring now to FIG. 5, there is shown a schematic cross-sectional diagram illustrating the results of further processing of the microelectronic fabrication whose schematic cross-sectional diagram is illustrated in FIG. 4.

As is illustrated within FIG. 5, the blanket bond pad passivation layer 28 has been simultaneously patterned to form a series of patterned bond pad passivation layers 28a, 28b' and 28b", along with further sequential patterning of the patterned second dielectric layer 22b to form a pair of twice patterned second dielectric layers 28b' and 28b", to thus form a second via 31a' which exposes the top surface of the bond pad 26 which is edge passivated, as well as a second aperture 31b' nominally centered above the option selection device 14b and stopping at the patterned etch stop layer 20b.

Within the preferred embodiment of the present invention, the second aperture 31b' defined by the pair of patterned bond pad passivation layers 28b' and 28b" and the pair of patterned second dielectric layers 22b' and 22b" and stopping at the patterned etch stop layer 20b provides for a pre-determined thickness of the patterned first dielectric layer 18b which in turn provides for a reproducible amount of protective material formed over the option selection device 14b when etching the blanket bond pad passivation layer 28 to form the series of patterned bond pad passivation layers 28a, 28b' and 28b". Thus, the microelectronic fabrication whose schematic cross-sectional diagram is illustrated in FIG. 5 has efficiently and reliably fabricated therein an option selection device structure. Typically, the second aperture 31b' is formed to an aperture depth of from about 1000 to about 70000 angstroms when stopping on the patterned etch stop layer 20b.

As is understood by a person skilled in the art, the preferred embodiment of the present invention is illustrative of the present invention rather than limiting of the present invention. Revisions and modifications may be made to methods, materials, structures and dimensions employed in fabricating a microelectronic fabrication in accord with the preferred embodiment of the present invention, while still fabricating a microelectronic fabrication in accord with the present invention, further in accord with the accompanying claims.

What is claimed is:

1. An option selection device structure comprising:
   a substrate;
   a terminal metal layer and an option selection device at a co-planar level over the substrate;

a patterned terminal metal passivation layer covering the option selection device with a via which accesses the terminal metal layer, the patterned terminal metal passivation layer having within its thickness an etch stop layer;

a barrier layer interposed between the option selection device and the patterned terminal metal passivation layer;

a bond pad layer within the via and physically contacting the terminal metal layer; and a patterned bond pad passivation layer upon the patterned terminal metal passivation layer and edge passivating the bond pad layer, wherein the patterned terminal metal passivation layer comprises a first dielectric layer above the terminal metal layer and the option selection device and underlying the etch stop layer and a second dielectric layer on the etch stop layer and underlying the patterned bond pad passivation layer.

2. The option selection device of claim 1 wherein the patterned bond pad passivation layer has formed therethrough and the patterned terminal metal passivation layer has aligned therein an aperture which terminates over the option selection device at the etch stop layer.

3. The option selection device structure of claim 2 wherein the aperture has a depth of from about 1000 to about 70000 angstroms.

4. The option selection device structure of claim 1 wherein the substrate is employed within a microelectronic fabrication selected from the group consisting of integrated circuit microelectronic fabrications, ceramic substrate microelectronic fabrications and optoelectronic microelectronic fabrications.

5. The option selection device structure of claim 1 wherein the option selection device is selected from the group consisting of a fuse and an anti-fuse.

6. The option selection device structure of claim 1 wherein the terminal metal layer comprises a copper containing conductor material.

7. The option selection device structure of claim 1 wherein the bond pad comprises an aluminum containing conductor material.

8. The option selection device of claim 1, wherein the barrier layer covers the terminal metal layer and the option selection device and underlying the first dielectric layer.

9. The option selection device of claim 8, wherein the barrier layer comprises silicon nitride, metal nitride and/or metal.

10. The option selection device of claim 1, wherein the first and second dielectric layers comprise silicon oxide or spin-on-polymer dielectric materials.

11. The option selection device of claim 1, wherein the etch stop layer comprises a nitrogen-containing material or a conductor material.

12. The option selection device of claim 11 wherein the nitrogen-containing material is a silicon nitride material.

13. The option selection device of claim 1, wherein the patterned bond pad passivation layer is a laminate of a silicon oxide dielectric material having formed thereupon a silicon nitride dielectric material.

14. An option selection device structure comprising:

a substrate;

a terminal metal layer and an option selection device at a co-planar level over the substrate;

a patterned terminal metal passivation layer covering the option selection device with a via which accesses the terminal metal layer, the patterned terminal metal passivation layer having within its thickness an etch stop layer sandwiched between a pair of dielectric layers, a bond pad layer within the via and physically contacting the terminal metal layer; and a patterned bond pad passivation layer upon the patterned terminal metal passivation layer and edge passivating the bond pad layer, wherein the patterned bond passivation layer is formed so as to directly contact a top surface of the bond pad layer.

15. The option selection device of claim 14 wherein the patterned bond pad passivation layer has formed therethrough and the patterned terminal metal passivation layer has aligned therein an aperture which terminates over the option selection device at the etch stop layer.

16. The option selection device of claim 14, wherein the etch stop layer comprises a nitrogen-containing material or a conductor material.

17. The option selection device of claim 16 wherein the nitrogen-containing material is a silicon nitride material.

18. The option selection device of claim 14, wherein the option selection device is selected from the group consisting of a fuse and an anti-fuse.

19. The option selection device of claim 14, further comprising a barrier layer interposed between the option selection device and the patterned terminal metal passivation layer.

20. The option selection device of claim 14, wherein the patterned bond pad passivation layer is a laminate of a silicon oxide dielectric material having thereupon a silicon nitride dielectric material.

* * * * *